United States Patent
Yang

(10) Patent No.: US 8,405,223 B2
(45) Date of Patent: Mar. 26, 2013

(54) MULTI-LAYER VIA STRUCTURE

(75) Inventor: Chih-kuang Yang, Hsin-Chu (TW)

(73) Assignee: Princo Middle East FZE, Dubai (AE)

( * ) Notice: Subject to any disclaimer, the term of this patent is extended or adjusted under 35 U.S.C. 154(b) by 0 days.

(21) Appl. No.: 13/092,895

(22) Filed: Apr. 22, 2011

(65) Prior Publication Data

US 2012/0007254 A1   Jan. 12, 2012

(30) Foreign Application Priority Data

Jul. 12, 2010   (TW) .............................. 99122895 A

(51) Int. Cl.
*H01L 23/48* (2006.01)

(52) U.S. Cl. ................... 257/774; 257/E23.011

(58) Field of Classification Search ............ 257/774, 257/E23.011
See application file for complete search history.

(56) References Cited

U.S. PATENT DOCUMENTS 5,731,047 A * 3/1998 Noddin .................. 427/555
8,008,781 B2 * 8/2011 Fillion et al. ............. 257/774

FOREIGN PATENT DOCUMENTS

CN   1988765 A   6/2007
CN   101112142 A   1/2008

* cited by examiner

*Primary Examiner* — Calvin Lee
*Assistant Examiner* — Monica D Harrison
(74) *Attorney, Agent, or Firm* — Cheng-Ju Chiang

(57) ABSTRACT

Disclosed is a multi-layer via structure, comprising a metal layer, a first via metal layer formed on a first open of a first dielectric layer and a second via metal layer formed on a second open of a second dielectric layer. The first and second via metal layers comprise first and second bottoms, first and second top portions, first and second inclined walls, respectively. The first and second inclined walls comprise first and second top edges, first and second bottom edges respectively. The second top edge has a point closest to a geometric center of the first bottom. A vertical projection of the point falls on the first inclined wall. Alternatively, a point of the second bottom edge, which is closest to the geometric center, has a vertical projection. The vertical projection is vertical to the metal layer and falls on the first inclined wall.

16 Claims, 5 Drawing Sheets

MULTI-LAYER VIA STRUCTURE

BACKGROUND OF THE INVENTION

1. Field of the Invention

The present invention generally relates to a multi-layer via structure, and more particularly to a multi-layer via structure applied for a flexible semiconductor device or a flexible multi-layer substrate.

2. Description of Prior Art

A multi-layer substrate can be utilized for manufacturing a package substrate, a printed circuit board, a flexible package substrate or a flexible printed circuit for realizing miniaturization of all electronic products is an inevitable trend in this modern world. Particularly, constant researches in the related industry are held for developing lighter, thinner, more flexible semiconductor devices or multi-layer substrates to create kinds of flexible and bendable electronic products. These flexible semiconductor devices or flexible multi-layer substrates can be applied in kinds of flexible and bendable electronic products more efficiently and can meet miniaturization demands of these electronic products. As the thicknesses of the flexible multi-layer substrates get thinner, the routing densities of the integrated circuits and the multi-layer substrates become higher.

Please refer to FIG. 1, which depicts a diagram of a multi-layer via structure with multi-layer buried vias formed for raising the routing density of the integrated circuit and the multi-layer substrate according to stacked via skill of prior art. As shown in FIG. 1, the idea of the stacked via structure is to locate the metal layers 10, 20 and 30 (metal line or bond pad) of different layers in the same perpendicular position. After the respective dielectric layers 80 and 90 are formed, the perpendicular vias are formed at the positions of the metal layers 10 and 20. Then, conducting metal material is offered to form via metals 60, 70 to eclectically connect the different metal layers 10, 20 and 30 (metal line or bond pad) higher and lower. It is an effective skill of decreasing the routing density of the integrated circuit and the multi-layer substrate. However, such skill can be merely applicable to the hard integrated circuit or the hard substrate but not applicable to the flexible integrated circuit and the flexible multi-layer substrate. The main reason is that the property of such stacked via structure leads to gather a large amount of metal materials in a via area and therefore, such stacked via structure has no flexibility almost. If such stacked via structure according to prior art is applied in the flexible integrated circuits and flexible multi-layer substrates and bent. The bending action can easily damage the stacked via structure.

Please refer to FIG. 2, which depicts a diagram of a multi-layer via structure with a cross-layer via (blind via) formed for raising the routing density of the integrated circuit and the multi-layer substrate according to stacked via skill of prior art. The idea of such stacked via structure is also to locate the metal layers 10 and 20 (metal line or bond pad) of different layers in the same perpendicular position. The respective dielectric layers 80 and 90 are employed to insulate the metal layers 10 and 20 from other metals. A single perpendicular via is formed for penetrating the aforesaid all layers. Then, the via metal 60 shown in FIG. 2 is formed by an etching process or a build up process to electrically connect the different metal layers 10 and 20. However, such skill still can merely be applicable to the hard integrated circuit or the hard substrate. The property of such stacked via structure remains to lead to gather a large amount of metal materials in a via area and therefore, such stacked via structure has no flexibility almost. Accordingly, such stacked via structure is not applicable to the flexible integrated circuit and the flexible multi-layer substrate.

Please refer to FIG. 3, which depicts a diagram of a multi-layer via structure with a cross-layer via having an inclined wall and formed according to stacked via skill of another prior art. Similarly as described in prior art shown in FIG. 2, the idea of such multi-layer via structure is to locate the metal layers 10 and 20 (metal line or bond pad) of different layers in the same perpendicular position roughly. The respective dielectric layers 80 and 90 are employed to insulate the metal layers 10 and 20 from other metals. A single perpendicular via is formed for penetrating the aforesaid all layers. Then, the via metal 60 shown in FIG. 3 is formed by an etching process or a build up process to electrically connect the different metal layers 10 and 20. However, the wall of the single perpendicular via is tilted and must have an angle with certain degrees. Consequently, the occupied area of the metal layers 20, 60 (bond pad) in the multi-layer substrate becomes larger and results in low routing density.

Please refer to FIG. 4, which depicts a diagram of a multi-layer via structure with multi-layer buried vias formed according to staggered via skill of prior art. As shown in FIG. 4, the via metal 60 is formed on the metal layer 10 in advance and extends outwards on the surface of the dielectric layer 80 with a certain position and a certain area (for connecting with the via metal 70). Then, the dielectric layer 90 is formed and an open is formed at the aforesaid certain area and the via metal 70 is formed at the aforesaid certain area. As shown in FIG. 4, the vertical line 99 passing through the edge of the via metal 70 falls on the aforesaid certain position of the via metal 60. This is a general arrangement in prior art that the via metal 70 is not overlapped with the via metal except the aforesaid certain area as much as possible. Such multi-layer via structure is the most common and the most widely used structure in prior art but it cannot decrease the size of the integrated circuit and multi-layer substrate as much as the stacked via structure shown in FIG. 3. Therefore, such multi-layer via structure still has inherent limitations for decreasing the routing density of the integrated circuit and the multi-layer substrate. Although, the flexibility of such multi-layer via structure is better than the flexibility of the stacked via structure, it is beyond the staggered via skill of prior art's reach to satisfy the further demands of the routing density for the flexible integrated circuit and the flexible multi-layer substrate nowadays.

Consequently, there is a need to develop a multi-layer via structure to solve the aforesaid drawbacks of prior arts and to break through the limitations to satisfy the thinner, more flexible demands of the flexible integrated circuits and flexible multi-layer substrates as increasing the routing densities of the flexible integrated circuits and flexible multi-layer substrates further.

SUMMARY OF THE INVENTION

An objective of the present invention is to provide a multi-layer via structure, which is thinner, more flexible and with higher routing density, and therefore, capable of applying in a flexible semiconductor device or a flexible multi-layer substrate. Moreover, the property of the higher routing density of the present invention also can be beneficial to a general package substrate or a print circuit board.

The multi-layer via structure of the present invention comprises a metal layer, a first dielectric layer, a first via metal layer, a second dielectric layer and a second via metal layer. The first dielectric layer covers the metal layer and has a first open above the metal layer. The first via metal layer is formed in the first open and on the first dielectric layer and comprises a first bottom, a first top portion formed on the first dielectric layer and a first inclined wall. The first inclined wall comprises a first top edge joining to the first top portion and a first bottom edge joining to the first bottom, and the first bottom has a geometric center. The second dielectric layer covers the first via metal layer and has a second open above the first top portion and the first inclined wall of the first via metal layer. The second via metal layer is formed on second open and the second dielectric layer and comprises a second bottom, a second top portion formed on the second dielectric layer and a second inclined wall. The second inclined wall comprises a second top edge joining to the second top portion and a second bottom edge joining to the second bottom. Significantly, the second top edge has a point closest to the geometric center. The vertical projection of the point, which is vertical to the metal layer, falls on the first inclined wall. Alternatively, the second bottom edge has a point closest to the geometric center. The vertical projection of the point, which is vertical to the metal layer, falls on the first inclined wall.

DETAILED DESCRIPTION OF THE INVENTION

Figure 5:
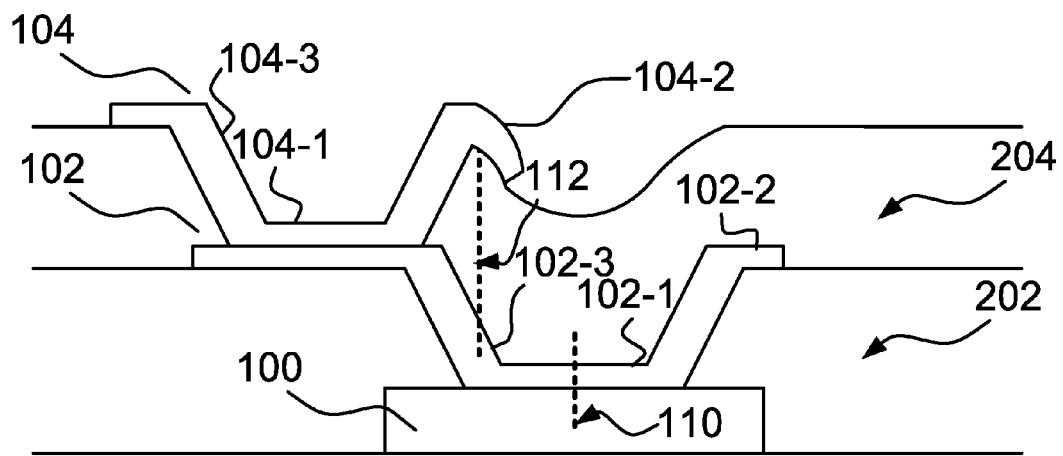
FIG. 5 depicts a diagram of a multi-layer via structure according to the first embodiment of the present invention.

Please refer to FIG. 5, which depicts a diagram of a multi-layer via structure according to the first embodiment of the present invention. The multi-layer via structure according to the first embodiment of the present invention comprises a metal layer 100, a first dielectric layer 202, a first via metal layer 102, a second dielectric layer 204 and a second via metal layer 104. As shown in FIG. 5, the metal layer 100 is employed as a metal line or a bond pad of a flexible semiconductor circuit or a flexible multi-layer substrate. The first dielectric layer 202 covers the metal layer 100 and has a first open above the metal layer 100. The first via metal layer 102 is formed in the first open and on the first dielectric layer 202. The first via metal layer 102 comprises a first bottom 102-1, a first top portion 102-2 and a first inclined wall 102-3. As shown in the figure, the first bottom 102-1 is formed at the position of the first open and has a geometric center. The geometric center can be a symmetry line or a centre of a circle depending on the shape of the first bottom 102-1. The first top portion 102-2 is formed on the first dielectric layer 202. The first inclined wall 102-3 comprises a first top edge and a first bottom edge. The first top edge joins to the first top portion 102-2. The first bottom edge joins to the first bottom 102-1.

The second dielectric layer 204 covers the first via metal layer 102. Because the appearance of the first via metal layer 102 is hollow, the appearance of the second dielectric layer 204 formed thereon is also similarly hollow. As shown in the figure, a second open is formed above the first top portion 102-2 of the first via metal layer 102. The second via metal layer is formed in the second open and on the second dielectric layer 204. The second via metal layer comprises a second bottom 104-1, a second top portion 104-2 and a second inclined wall 104-3. The second bottom 104-1 is formed at the position of the second open. The second top portion 104-2 is formed on the second dielectric layer 204. The second inclined wall 104-3 comprises a second top edge and a second bottom edge. The second top edge joins to the second top portion 104-2. The second bottom edge joins to the second bottom 104-1.

The first top portion 102-2 of the first via metal layer 102 is extended outward to include a position, which the second via metal layer 104 is predeterminedly formed later and prepared for joined with the second bottom 104-1, i.e. as well known as forming a staggered multi-layer via structure. The significant difference between present invention and prior arts is the second top edge of the second via metal layer 104 has a point closest to the geometric center 110 of the first bottom 102-1. A vertical projection 112 of the aforesaid point is vertical to the metal layer 100 and falls on the first inclined wall 102-3. Namely, the first via metal layer 102 and the second via metal layer 104 are partially overlapped with each other in top view.

Figure 6:
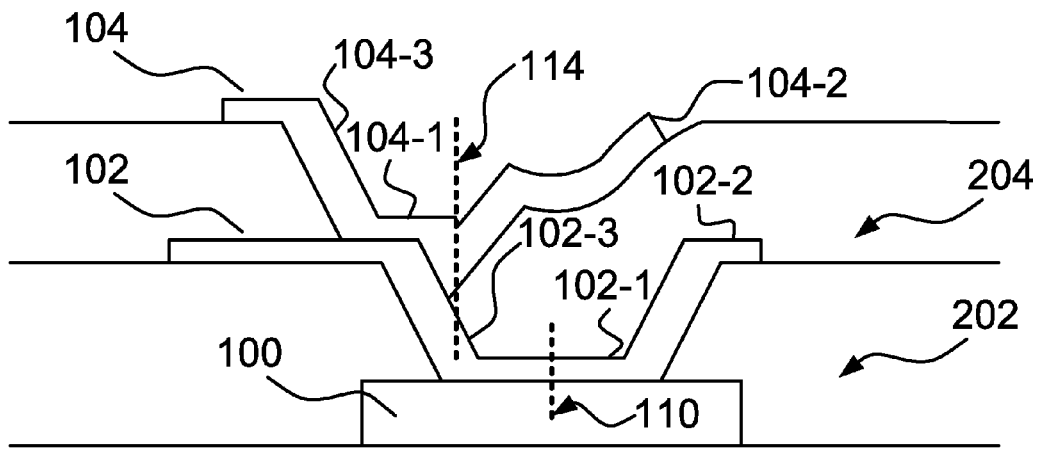
FIG. 6 depicts a diagram of a multi-layer via structure according to the second embodiment of the present invention.

Please refer to FIG. 6, which depicts a diagram of a multi-layer via structure according to the second embodiment of the present invention. The structure of the second embodiment of the present invention is similar to that of the first embodiment. However, as shown in the figure, the second open of the second dielectric layer 204 is above the first top portion 102-2 and the first inclined wall 102-3. The second open exposes a part of the first top portion 102-2 and a part of the first inclined wall 102-3. Therefore, the second bottom edge of the second bottom 104-1 of the second dielectric layer 204 has a point closest to the geometric center 110 of the first bottom 102-1. A vertical projection 114 of the aforesaid point is vertical to the metal layer 100 and falls on the first inclined wall 102-3. Namely, the first via metal layer 102 and the second via metal layer 104 are partially overlapped more than the first embodiment with each other in top view.

Figure 1:
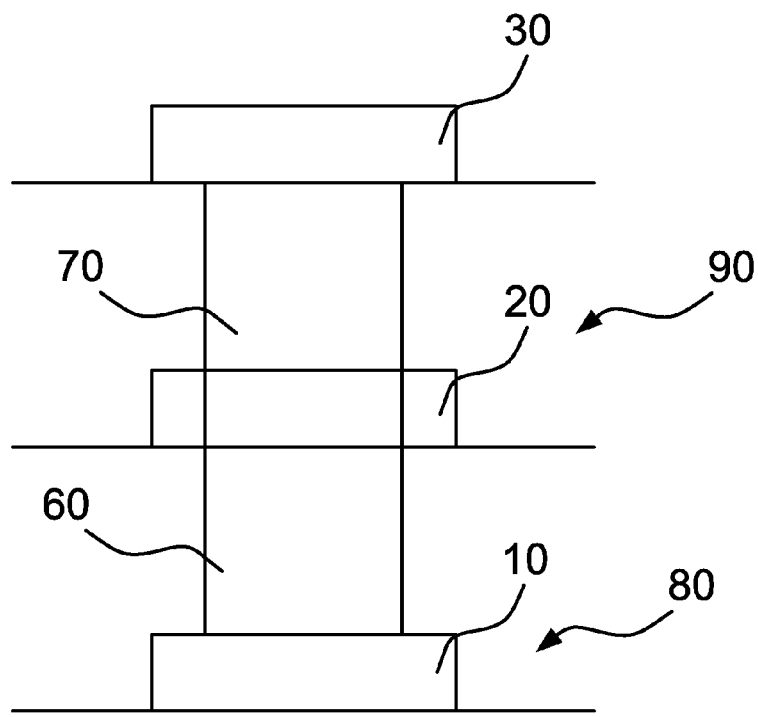
FIG. 1 depicts a diagram of a multi-layer via structure with multi-layer buried vias formed according to stacked via skill of prior art.
Figure 2:
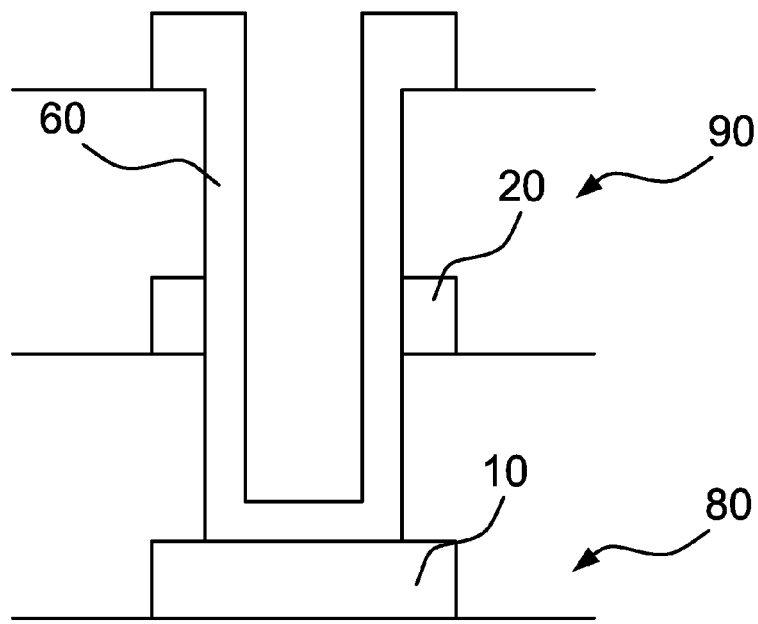
FIG. 2 depicts a diagram of a multi-layer via structure with a cross-layer via (blind vias) formed according to stacked via skill of prior art.
Figure 3:
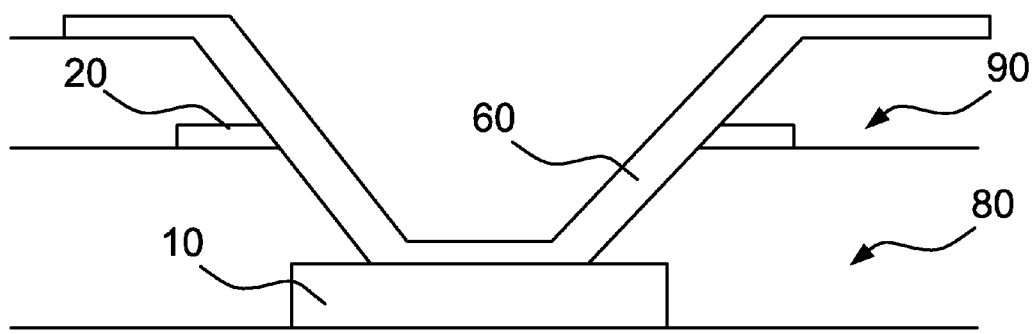
FIG. 3 depicts a diagram of a multi-layer via structure with a cross-layer via having an inclined wall and formed according to stacked via skill of another prior art.
Figure 4:
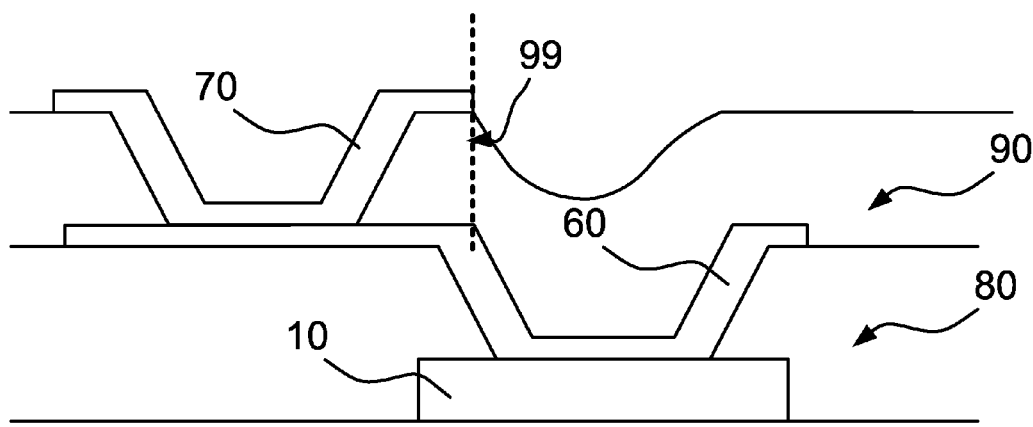
FIG. 4 depicts a diagram of a multi-layer via structure with multi-layer buried vias formed according to staggered via skill of prior art.
Figure 7:
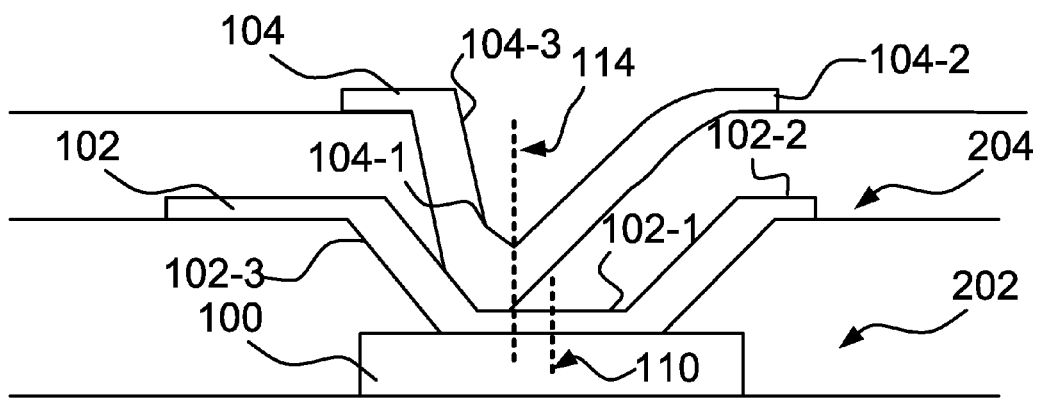
FIG. 7 depicts a diagram of a multi-layer via structure according to the comparative embodiment of the present invention.

Please refer to FIG. 7, which depicts a diagram of a multi-layer via structure according to the comparative embodiment of the present invention. The structure of the comparative embodiment is similar to those of the first and second embodiments. However, the significant difference between the comparative embodiment and the first, second embodiments is: the second bottom edge of the second bottom 104-1 of the second via metal layer 104 has a point closest to the geometric center 110 of the first bottom 102-1. However, the vertical projection 114 of the aforesaid point which is vertical to the metal layer 100 falls on the first bottom 102-1 but not the first inclined wall 102-3. Namely, in this comparative embodiment, the first via metal layer 102 and the second via metal layer 104 are partially overlapped with each other more than the first and second embodiments in top view. The multi-layer via structure of the comparative embodiment is more like the staggered multi-layer via structures according to prior arts shown in FIG. 2 and FIG. 3. Therefore, the flexibility of the multi-layer via structure of the comparative embodiment is not good.

By comparing the embodiments of the present invention shown in FIG. 5 and FIG. 6 with the comparative embodiment shown in FIG. 7, the multi-layer via structure according to the present invention not only retains the staggered via structure for applying to the flexibility demands of the flexible integrated circuits and flexible multi-layer substrates, and makes the thicknesses of the flexible integrated circuits and flexible multi-layer substrates smaller, but also increases the routing densities of the flexible integrated circuits and flexible multi-layer substrates further. Moreover, the multi-layer via structure of the present invention is unlike the stacked via structure of prior arts, which a large amount of metal materials are formed and gathered in the via area due to the stacked via property just for raising the routing density unilaterally. Accordingly, the stacked via structure of prior arts have no flexibility almost and therefore not applicable to the flexible integrated circuits and flexible multi-layer substrates.

Please refer to FIG. 8a~FIG. 8h. FIG. 8a to FIG. 8h show a flowchart of the manufacture method of the multi-layer via structure in profile according to the second embodiment of the present invention.

Figure 8A:
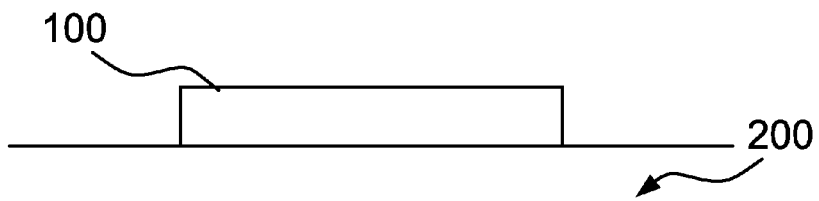
FIG. 8a to FIG. 8h show a flowchart of the manufacture method of the multi-layer via structure in profile according to the second embodiment of the present invention.

As shown in FIG. 8a, a metal layer 100 is formed on a dielectric layer 200 of a flexible integrated circuit or a flexible multi-layer substrate.

Figure 8B:
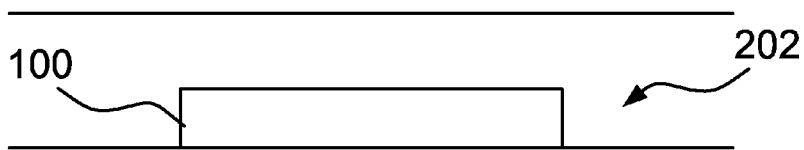

As shown in FIG. 8b, a first dielectric layer 202 is formed on the metal layer 100 to cover the metal layer 100.

Figure 8C:
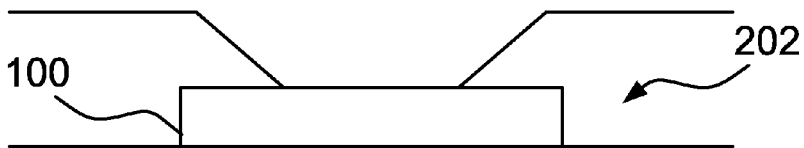

As shown in FIG. 8c, a first open is formed above the metal layer 100. The formation of the first open can be defined by a lithography process or formed by an optical laser drilling but the present invention does not have any specific limitation thereto. As long as the resolution, the depth of field are good enough for defining the first open and the energy, the resolution of the optical laser drilling are good enough for forming the first open at an uneven surface of a layer.

Figure 8D:
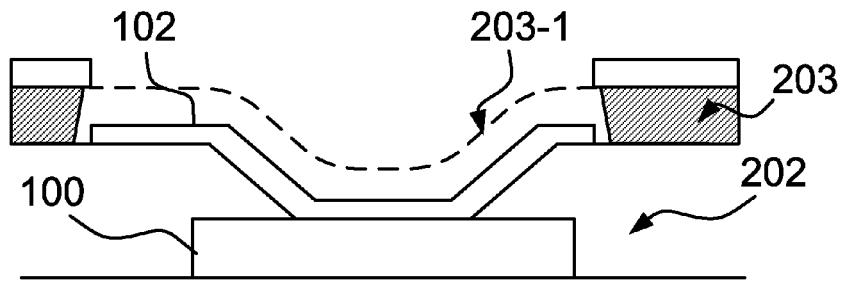

As shown in FIG. 8d, in case that the negative photoresist employed in a metal lift off process is illustrated, at least one photoresist layer 203 is coated on the first dielectric layer 202. After the a photolithography process is proceeded to the photoresist layer 203 except the photoresist layer 203-1 at the predetermined position of the first via metal layer 102, the developer is utilized to remove the photoresist layer 203-1 at the predetermined position. Then the first via metal layer 102 is formed.

Figure 8E:
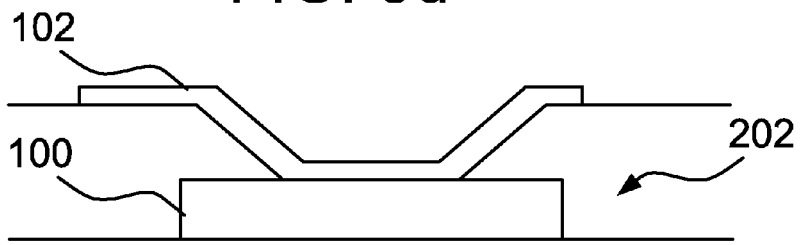

Then, as shown in FIG. 8e, the first open and the first bottom, the first top portion and the first inclined wall of the first via metal layer 102 in a predetermined area around are completed after the photoresist layer 203 and the metal layer formed thereon are removed at the same time as the first via metal layer 102 is formed. The present invention does not have any specific limitation to the formation method of the first via metal layer 102. Nevertheless, with the practical experiments proceeded by the inventor, the metal lift off process is preferable to form the metal layer with accurate position, precise shape and even thickness.

Figure 8F:
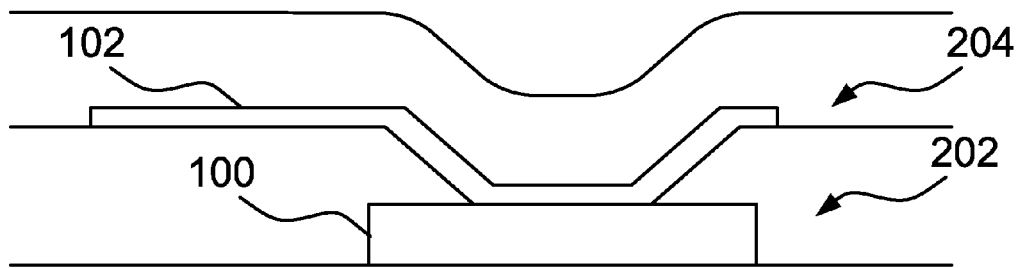

As shown in FIG. 8f, the second dielectric layer 204 is formed to cover the first via metal layer 102. Because the appearance of the first via metal layer 102 is hollow, the appearance of the second dielectric layer 204 formed thereon is also similarly hollow.

Figure 8G:
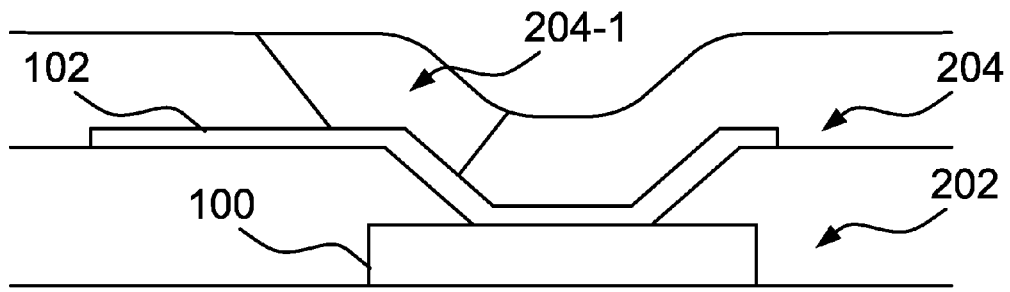

As shown in FIG. 8g, a second open is formed above the first top portion and the first inclined wall of the first via metal layer 102. The formation of the second open can be defined by a lithography process or formed by an optical laser drilling but the present invention does not have any specific limitation thereto. As long as the resolution, the depth of field are good enough for defining the second open and the energy, the resolution of the optical laser drilling are good enough for forming the second open at an uneven surface of a layer.

Figure 8H:
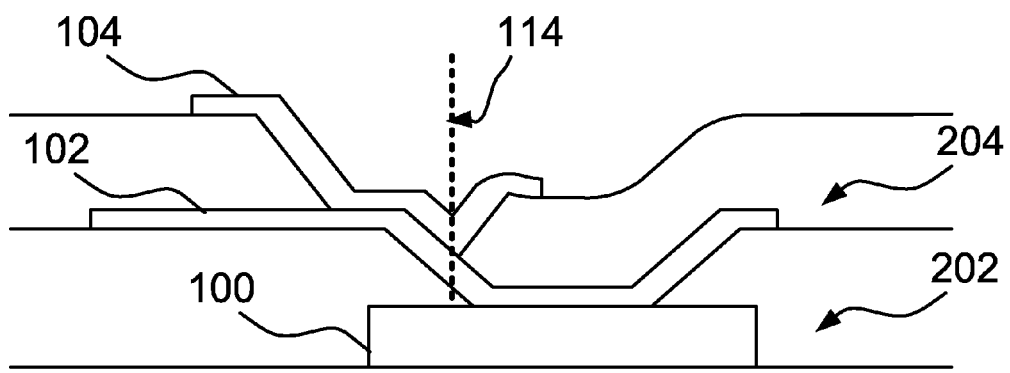

As shown in FIG. 8h, the second open and the second bottom, the second top portion and the second inclined wall of the second via metal layer 102 can be formed in the second open and a predetermined area around the second open. A point of the second bottom edge of the second via metal layer 104 closest to the geometric center of the first bottom 102-1 has a vertical projection 114. The vertical projection 114 falls on the first inclined wall. Meanwhile, the formation method of the second via metal layer 104 can be the same formation method of the first via metal layer 102, the metal lift off process. The present invention does not have any specific limitation to the formation method of the second via metal layer 104. Nevertheless, with the practical experiments proceeded by the inventor, the metal lift off process is preferable to form the metal layer among all kinds of processes, particularly for the uneven bottom surface of the second open as shown in FIG. 8g. For forming the second via metal layer 104 with accurate position, precise shape and even thickness on the uneven bottom, the metal lift off process is preferable. The manufacture method of the multi-layer via structure according to the second embodiment of the present invention is illustrated for explanation as aforementioned. However, the same manufacture method also can be applied to the first embodiment of the present invention. Significantly, the determined position of the second open is different from the first embodiment.

In conclusion, the multi-layer via structure according to the present invention can not only be applied to the thinner, more flexible demands of the flexible integrated circuits and flexible multi-layer substrates, but also increases the routing densities of the flexible integrated circuits and flexible multi-layer substrates further at the same time.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:
1. A multi-layer via structure, comprising:
   a metal layer;
   a first dielectric layer, covering the metal layer, and having a first open above the metal layer;
   a first via metal layer, formed in the first open and on the first dielectric layer, and comprising a first bottom, a first top portion formed on the first dielectric layer and a first inclined wall, and the first inclined wall comprises a first top edge joining to the first top portion and a first bottom edge joining to the first bottom, and the first bottom has a geometric center;
   a second dielectric layer, covering the first via metal layer, and having a second open above the first top portion and the first inclined wall of the first via metal layer; and
   a second via metal layer, formed in the second open and on the second dielectric layer, and comprising a second bottom, a second top portion formed on the second dielectric layer and a second inclined wall, and the second inclined wall comprises a second top edge joining to the second top portion and a second bottom edge joining to the second bottom, wherein the second bottom edge has a point closest to the geometric center, and a vertical projection of the point, which is vertical to the metal layer, falls on the first inclined wall.

2. The multi-layer via structure of claim 1, wherein the second via metal layer is formed by a metal lift off process to form the second bottom, the second top portion and the second inclined wall at the same time.

3. The multi-layer via structure of claim 1, wherein the second open is defined by photolithography.

4. The multi-layer via structure of claim 1, wherein the second open is formed by optical laser drilling.

5. The multi-layer via structure of claim 1, wherein the first via metal layer is formed by a metal lift off process to form the first bottom, the first top portion and the first inclined wall at the same time.

6. The multi-layer via structure of claim 1, wherein the first open is defined by photolithography.

7. The multi-layer via structure of claim 1, wherein the first open is formed by optical laser drilling.

8. The multi-layer via structure of claim 1, wherein multi-layer via structure is applied in a flexible multi-layer substrate or a flexible semiconductor circuit.

9. A multi-layer via structure, comprising:
a metal layer;
a first dielectric layer, covering the metal layer, and having a first open above the metal layer;
a first via metal layer, formed in the first open and on the first dielectric layer, and comprising a first bottom, a first top portion formed on the first dielectric layer and a first inclined wall, and the first inclined wall comprises a first top edge joining to the first top portion and a first bottom edge joining to the first bottom, and the first bottom has a geometric center;
a second dielectric layer, covering the first via metal layer, and having a second open above the first top portion and the first inclined wall of the first via metal layer; and
a second via metal layer, formed in the second open and on the second dielectric layer, and comprising a second bottom, a second top portion formed on the second dielectric layer and a second inclined wall, and the second inclined wall comprises a second top edge joining to the second top portion and a second bottom edge joining to the second bottom, wherein the second top edge has a point closest to the geometric center, and a vertical projection of the point, which is vertical to the metal layer, falls on the first inclined wall.

10. The multi-layer via structure of claim 9, wherein the second via metal layer is formed by a metal lift off process to form the second bottom, the second top portion and the second inclined wall at the same time.

11. The multi-layer via structure of claim 9, wherein the second open is defined by photolithography.

12. The multi-layer via structure of claim 9, wherein the second open is formed by optical laser drilling.

13. The multi-layer via structure of claim 9, wherein the first via metal layer is formed by a metal lift off process to form the first bottom, the first top portion and the first inclined wall at the same time.

14. The multi-layer via structure of claim 13, wherein the first open is defined by photolithography.

15. The multi-layer via structure of claim 9, wherein the first open is formed by optical laser drilling.

16. The multi-layer via structure of claim 9, wherein the multi-layer via structure is applied in a flexible multi-layer substrate or a flexible semiconductor circuit.

* * * * *